United States Patent
Kawase

(10) Patent No.: US 7,431,860 B2
(45) Date of Patent: Oct. 7, 2008

(54) ETCHING PROCESS

(75) Inventor: Takeo Kawase, Cambridge (GB)

(73) Assignee: Seiko Epson Corporation, Tokyo (JP)

( * ) Notice: Subject to any disclaimer, the term of this patent is extended or adjusted under 35 U.S.C. 154(b) by 261 days.

(21) Appl. No.: 10/149,392

(22) PCT Filed: Oct. 15, 2001

(86) PCT No.: PCT/GB01/04591

§ 371 (c)(1),
(2), (4) Date: Jul. 12, 2002

(87) PCT Pub. No.: WO02/33740

PCT Pub. Date: Apr. 25, 2002

(65) Prior Publication Data

US 2003/0029831 A1  Feb. 13, 2003

(30) Foreign Application Priority Data

Oct. 16, 2000 (GB) ................................. 0025342.7

(51) Int. Cl.
*B44C 1/22* (2006.01)

(52) U.S. Cl. ............................ 216/83; 216/17; 216/18; 216/41; 438/745; 438/749; 134/2; 134/3; 134/26

(58) Field of Classification Search ................... 216/17, 216/18, 27, 41, 83; 347/65; 438/745, 749; 134/2, 3, 26
See application file for complete search history.

(56) References Cited

U.S. PATENT DOCUMENTS 4,528,071 A * 7/1985 Glashauser ................... 216/12
4,849,066 A * 7/1989 Deal et al. ..................... 216/90

(Continued)

FOREIGN PATENT DOCUMENTS

DE       3047884 A1    7/1982

(Continued)

OTHER PUBLICATIONS

Granlund et al., "Patterning of polymer light-emitting diodes with soft lithography", Advanced Materials. VCH. Verlagsgesellschaft. Weinheim. DE. vol. 12. No. 4. XP000919758, pp. 269-273, Feb. 2000.

(Continued)

*Primary Examiner*—Shamim Ahmed
(74) *Attorney, Agent, or Firm*—Oliff & Berridge, PLC

(57) ABSTRACT

A method for etching a pattern in a material in precise target areas comprising depositing selectively onto the material droplets of a substance for dissolving or reacting chemically with the material. Droplets may be deposited from a print head of the type having a nozzle from which the material may be ejected as a series of droplets, such as an ink jet print head. In a preferred application, a series of ridges can be etched from an organic insulator layer overlying a photoemissive organic polymer. A conductive layer is then deposited and the ridges of organic insulator are dissolved by solvent washing to provide an array of conductive stripes which can be used as a cathode for an electroluminescent display device. In combination, both anode and cathode can be fabricated for a display device without the need for photolithography, which is particularly advantageous for the fabrication of large area display devices.

20 Claims, 13 Drawing Sheets

U.S. PATENT DOCUMENTS

| | | | | |
|---|---|---|---|---|
| 5,275,658 | A | * | 1/1994 | Kimura ................. 118/302 |
| 5,861,671 | A | * | 1/1999 | Tsai et al. ............... 257/750 |
| 5,882,489 | A | * | 3/1999 | Bersin et al. .......... 204/192.35 |
| 5,980,769 | A | * | 11/1999 | Yanagisawa et al. ......... 216/67 |
| 6,033,939 | A | * | 3/2000 | Agarwala et al. .......... 438/132 |
| 6,106,907 | A | * | 8/2000 | Yoshikawa et al. .......... 428/1.1 |

FOREIGN PATENT DOCUMENTS

| | | |
|---|---|---|
| EP | 0 930 641 A2 | 7/1999 |
| GB | 1093138 | 10/1965 |
| GB | 2 294 909 | 5/1996 |
| JP | A 3-25937 | 2/1991 |
| JP | A-04-225231 | 8/1992 |
| JP | 05303009 A * | 11/1993 |
| JP | A-08-279484 | 10/1996 |
| JP | A-11-307257 | 11/1999 |
| JP | A 2000-104182 | 4/2000 |
| JP | A-2000-171814 | 6/2000 |
| WO | WO 99/21233 | 4/1999 |
| WO | WO 01 47044 A2 | 6/2001 |

OTHER PUBLICATIONS

Yang et al., "Organic/Polymeric Electroluminescent Devices Processed by Hybrid Ink-Jet Printing". Journal of Materials Science. Materials in Electronics, Chapman and Hall. London. GB. XP001032490. pp. 89-96, Mar. 2000.

* cited by examiner

1st droplet of solution

2nd droplet of solution

Partial dissolving of the top layer into the solution

Ring-shaped deposition of the material of the top layer

1 Droplet

SCAN: 500μM    VERT:-69 A
SPEED: MEDIUM  HORIZ:-143μM

I CUR: 317 A   @279μM         M CURSOR = 135
I CUR: 248 A   @135μM

3 Droplets

8 Droplets

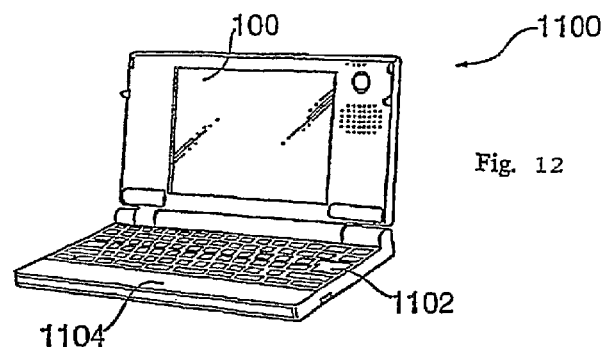
Fig. 12
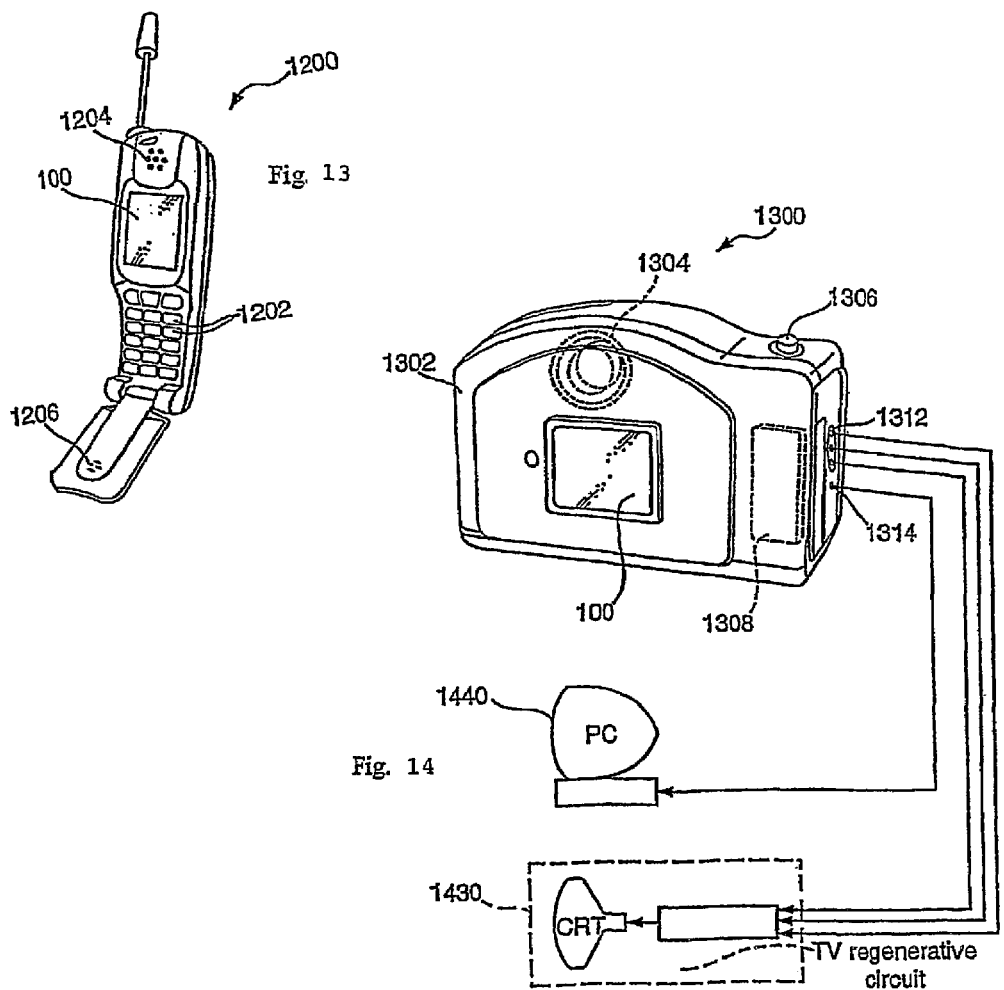
Fig. 13
Fig. 14

ETCHING PROCESS

BACKGROUND

The present invention relates to etching of materials.

In many modern industrial processes it is necessary to etch intricate and accurately defined patterns in a material. The etching may be confined to within the material or the etching process may be continued until the material is etched through, thereby to expose an underlying material. In many industrial applications such as, for example, the fabrication of electronic, optical or optoelectronic devices, the etching steps form a very critical phase of device fabrication, as the etching process usually dictates the accuracy to which the devices are ultimately manufactured.

The use of etch masks, such as photo masks or shadow masks, is well known in such fabrication techniques. Hence, these processes will not be described in detail in the context of the present invention. However, in recent years, new forms of devices have been proposed for which such conventional etching techniques present severe process concerns. Furthermore, the etching of relatively long but extremely narrow lines has, for a long period of time, presented severe fabrication difficulties as it is very difficult to produce mechanically robust etch masks which will provide the required definition in the finished product.

Other concerns are also known to exist with known etching techniques. For example, in certain processes where it is required to etch through a layer of material to expose a pattern of an underlying material, such as a substrate, the surface of the substrate usually exhibits a degree of unevenness which can be regarded as a series of peaks and troughs. Therefore, to etch through the material to leave an exposed pattern of the substrate without any residue of the material being etched usually requires the etch process to be continued after initial exposure of the peaks on the surface of the substrate. The substrate itself is therefore also etched in the etching process. In many cases this may be undesirable as the substrate surface may have been provided with a very thin coating and therefore the etch process must necessarily be very carefully controlled to ensure that over etching does not occur. Additionally, extensive research is now taking place into the use of semiconductor organic materials in electronic devices, for example display devices, incorporating electroluminescent organic polymer light emitting diodes or integrated circuits incorporating organic polymer transistors. Conventional known etching processes present even greater concerns for the fabrication of such devices, as will be outlined below.

Electroluminescent displays represent a novel approach for fabricating high quality, multicolour displays. In an electroluminescent display a soluble polymer is deposited onto a solid substrate, such as for example, glass, plastics or silicon. Inkjet printing techniques have been proposed to deposit the soluble polymers not only because of the relatively low cost of such techniques but also because of the ability to use inkjet technology for large area processing and, therefore, the fabrication of relatively large area displays. For a multicolour electroluminescent display a number of soluble organic polymers may each be deposited as an array of dots of the polymers to provide the red, green and blue emissive layers for the display. The use of an inkjet technique makes this deposition of different polymers possible without deterioration of the polymer materials caused by the patterning processes.

Generally, two kinds of driving scheme can be used to address the pixels of the display. One is a passive matrix and the other is an active matrix scheme. The active matrix has patterned anode pixels, each with thin film driving transistors (usually two per pixel as the organic polymers are current driven devices) and a common cathode. In order to fabricate the patterned anode pixels and the thin film transistors (TFT's), conventional photolitographic technology is generally used. This process is carried out before the deposition of the organic layers so it does not affect the performance of the organic polymer materials. Fine patterning to fabricate the cathode is not required as the cathode may be a conductive layer common to all of the pixels. Hence, the common cathode can be fabricated over the organic layers using an evaporation technique, with the use of a metal shadow mask to define the edge frame of the cathode.

The passive matrix driving scheme uses patterned anodes and cathodes arranged as mutually perpendicular row and column electrodes on either side of the organic polymer emissive layers. In terms of the deposition of a cathode, the active matrix scheme is easier to fabricate, but the active matrix scheme still costs more to produce than the passive matrix scheme due to the formation of the TFT's for each pixel. Hence, the preferred way of driving such a display is to use a passive matrix addressing scheme. However, there are significant technical difficulties associated with the patterning of the anode and, in particular, the cathode for such displays.

The anode may be fabricated directly onto the substrate prior to the deposition of any soluble organic polymer layer. The anode is usually fabricated from indium tin oxide (ITO), as this material is conductive and relatively transparent. The ITO layer is formed as a continuous layer on the substrate and is then patterned using a photolithographic process to provide the anode array. However, the photolithographic process requires the use of a photo mask. Whilst such photo masks are commonly used to fabricate the anode array, their use becomes increasingly difficult as the size of the display area increases because problems are encountered in maintaining the required accuracy of definition throughout all areas of the mask. For use with large area electroluminescent displays, the use of such photo masks becomes prohibitively expensive which negates the potential cost benefits arising from the use of the relatively inexpensive organic polymer materials.

With regard to the cathode, the patterning of the cathode for an organic polymer display gives rise to significant difficulties. The cathode must necessarily overlie a soluble organic polymer layer. The traditional photolithographic techniques cannot be used for the patterning of the cathode as the etchants used severely damage or degrade the underlying organic materials. Other techniques have, therefore, been proposed for cathode patterning, such as the use of a stainless steel shadow mask, but such masks lack the required resolution in the fabricated array. Furthermore, the use of pre-patterned mushroom shaped photoresist dividers has also been proposed but such dividers are costly to produce and, in view of their fabrication process, are not suitable for large area patterning.

It has also been proposed to pattern a shadow mask through the use of inkjet printing of inert polymers followed by a lift off step using an adhesive tape. However, such a process suffers from poor resolution and usually gives rise to an unacceptably high density of defects in the achieved cathode array.

SUMMARY

It can be seen, therefore, that there is a need to be able to reliably fabricate well defined patterns in a material, including relatively long but extremely thin narrow lines, by a process which does not rely on the use of a photo mask or a shadow mask. Furthermore, there is also a need to be able to readily select the etching substances so that an underlying layer to a layer to be etched can act readily as an etch stop layer for the selected etch substance. This would assist significantly the etching process as the etch step could be continued to ensure good definition in the etch pattern without concern for damaging or contaminating the underlying layer. This is particularly so for the fabrication of organic polymer devices such as organic polymer displays, where such a process could then be adopted to enable the anode and the cathode for the display to be fabricated by a cost effective solution, even for large area displays, without the contamination concerns arising from the use of known etch processes.

According to a first aspect of the present invention there is provided a method of etching a material in precise target areas comprising depositing selectively onto the material a substance for dissolving or reacting chemically with the material.

By depositing an etchant in accordance with the present invention it is possible to etch precise target areas without using a mask, thus avoiding the difficulties associated with the use of masks as discussed above. Very precise etching of localised target areas is possible in accordance with the present invention.

Preferably, the substance is deposited from a print head of the type having a nozzle from which the material may be ejected as a series of droplets. Advantageously, the method comprises etching through the material to expose an area of an underlying material.

Most advantageously, the underlying material comprises an etch stop layer for the substance.

In a preferred arrangement the method comprises etching an array of holes in the material thereby to provide an array of exposed areas of the underlying material.

In an alternative arrangement the method comprises exposing an area of the underlying material in the form of an elongate strip.

Advantageously, the method comprises exposing a plurality of elongate strips of the underlying material.

Preferably, the elongate strips are substantially parallel so as to provide an array of substantially parallel elongate strips of exposed areas of the underlying material spaced by elongate strips of the material.

Most preferably, the or each elongate strip has a width less than the diameter of a droplet of the substance upon deposition onto the material.

In a preferred arrangement, the material includes boundary portions defining the or each elongate strip and wherein further droplets of the substance are deposited onto one of the boundary portions, thereby to cause the said one of the boundary portions to migrate towards the other boundary portion and reduce the width of the elongate strip.

Advantageously, the method further comprises etching the exposed area or areas of the underlying material using a dry or a wet etch process.

Preferably, the exposed area or areas of the underlying material are etched by depositing a further substance from a print head of the type wherein the further substance is deposited from a nozzle in the form of droplets.

Most preferably, a further material is deposited into contact with the exposed area or areas of the underlying material.

The further material may be deposited as a layer overlying the material and extending into contact with the exposed area or areas of the underlying material.

Advantageously, the further material is selectively deposited by evaporation or sputtering.

In an alternative arrangement the further material is selectively deposited in liquid form on to the exposed area or areas of the underlying material from a print head of the type in which the further material is deposited in the form of droplets from a nozzle.

Most advantageously, the exposed area or areas of underlying material has a wettability for the further material which is greater than the wettability of the material for the further material so as to provide self alignment of the further material on the exposed area or areas of underlying material.

In a first preferred arrangement the material is removed to provide an area or areas of the further material.

Advantageously, the material comprises an organic material, the substance comprises a solvent for the organic material and the further material comprises a layer of conductive material.

Preferably, the conductive material comprises a material which has a work function of less than about 4.0 electron volts.

The underlying material may comprise polyfluorene or copolymer of fluorene in combination with a conjugated molecule group and the organic material may comprise polyvinyl phenol, polyvinyl alcohol or polymethylmethacrylate (PMMA).

Advantageously, the organic material may comprise a conjugated molecule or conjugated polymer.

Preferably, the solvent comprises at least one of methanol, ethanol, dimethylimadizolinidine, butanol, 1-propanol or 2-propanol.

Most preferably, the underlying material is supported on a substrate which may comprise rigid glass, plastics or silicon or, alternatively, a web of spoolable plastics material.

By using the above method an electrode array, such as a cathode array, may be fabricated for a display device.

In an alternative arrangement the material comprises an organic material, the further material comprises a further organic material and the substance comprises a solvent for the organic material.

Preferably, the organic material comprises a non-polar organic material and the further organic material comprises a polar organic material or an organic material suspended in a polar solvent so as to provide self alignment of the further organic material on the exposed area or areas of the underlying material when deposited from the print head.

Advantageously, the further organic material comprises a conductive organic material.

Preferably, the conductive organic material comprises Poly-3,4-ethylene dioxythiophene.

In a preferred arrangement the method comprises dry etching using a plasma of fluorinated carbon prior to the deposition of the further material which advantageously may be preceded by dry etching using a plasma of oxygen.

Preferably, the organic material, which may comprise a non polar polymer, is removed with a solvent, which may comprise a hydrocarbonic solvent.

In a most preferred arrangement, the underlying material comprises a substrate, which may comprise rigid glass, plastics or silicon or, alternatively, a web of a spoolable plastics material.

In accordance with the above alternative arrangement, an electrode array, such as an anode array, may be fabricated for a display device.

Advantageously, the method may further comprise providing an overlayer of polyvinyl phenol, polyvinyl alcohol or polymethylmethacrylate (PMMA).

The overlayer may also comprise a conjugated molecule or a conjugated polymer.

Alternatively, the substance may react chemically with the material to form a further substance for removal by washing.

Preferably, the material comprises a non-transparent material, the substance comprises an alkyl solution or an acid solution and the material comprises a metal soluble in the alkyl solution or the acid solution. In the above manner, it is possible to fabricate an etch mask or a shadow mask.

According to a second aspect of the invention there is provided a display device comprising an electrode fabricated in accordance with the above first preferred arrangement and/or an electrode fabricated in accordance with the above alternative arrangement.

The display device may advantageously comprise an organic polymer emissive layer including polyfluorene or copolymer of fluorene in combination with a conjugated molecule group.

In a third alternative arrangement, the material may comprise a fluorinated polymer layer and the substance comprises a fluorinated organic solvent for dissolving the fluorinated polymer layer thereby to provide a dewetting bank structure in the fluorinated polymer layer.

According to an alternative aspect of the invention, there is provided a dewetting bank structure fabricated by a method in accordance with the third alternative arrangement.

In a further aspect of the present invention, the further material may comprise DNA or a protein.

BRIEF DESCRIPTION OF THE DRAWINGS

Embodiments of the present invention will now be described, by way of further example only and with reference to the accompanying drawings in which:—

FIG. 12 is a schematic view of a mobile personal computer incorporating a display device having a driver according to the present invention;

FIG. 13 is a schematic view of a mobile telephone incorporating a display device having a driver according to the present invention, FIG. 14 is a schematic view of a digital camera incorporating a display device having a driver according to the present invention.

DETAILED DESCRIPTION OF THE EMBODIMENTS

Various aspects of the present invention will now be described with reference to the fabrication of an anode and a cathode for organic polymer electroluminescent and photoluminescent display devices by the use of inkjet etching.

Figure 1:
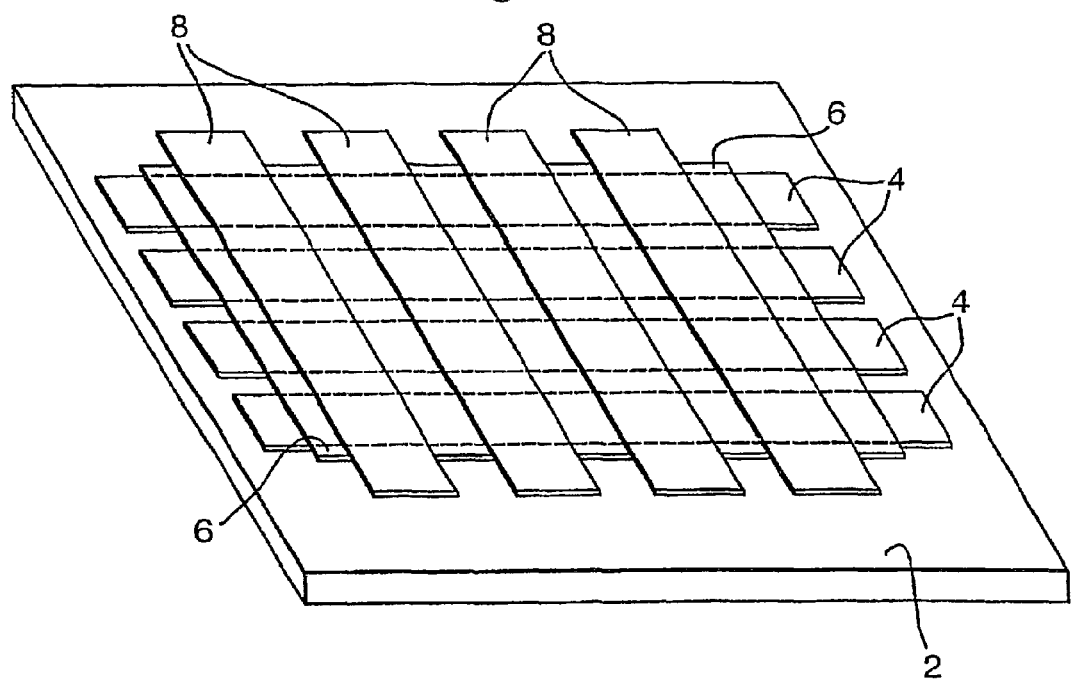
FIG. 1 is a diagrammatic illustration of an organic polymer display device.

Referring to FIG. 1, an organic polymer display device comprises a substrate 2, such as glass or plastics material, supporting an anode 4 in the form of an array of horizontal row electrodes of conductive material, such as ITO, $ZnO_2$, or a thin metal film, which is semi-transparent. An organic polymer layer 6 is provided to overly the anode 4. The layer 6 might typically comprise small molecules of $Alq_3$ or a conjugated polymer mix of F8/F8BT/TFB, where F8 is [poly(9,9-dioctylfluorene)], F8BT is [poly(9,9-dioctylfluorene-co-2,1,3-benzothiadizole)] and TFB is [poly(9,9-dioctylfluorene-co-N-(4-butylphenyl) diphenylamine)]. These conjugated polymers are derivatives of polyfluorene, and they are soluble in organic solvents, such as chloroform, toluene and xylene. Spin coating is used to make a monochrome display, and inkjet deposition techniques have been developed to deposit different polymers for multi-colour display. A cathode 8, in the form of an array of vertical column electrodes of a conductive material, is provided on the polymer layer 6. In order to assist electron injection into the polymer materials, low work function elements typically having a work function of less than about 4.0 electron volts, such as, Ca, Li, Mg, Al, Ti, and rare-earth elements are used for the cathode electrodes. These elements are chemically unstable in general.

In a typical display device the anode 4 may be fabricated by depositing a layer of ITO onto the substrate 2 and then etching the ITO layer using a conventional photolithographic process. Such a process can achieve very high resolution and can be readily used because the anode 4 is formed directly on the substrate, which is usually glass, plastics or silicon. However, photolithographic techniques are relatively complex and are time consuming and costly to implement. Additionally, this complexity is enhanced with increase in the size of display as the photolithographic mask becomes extremely difficult to fabricate to the required definition over all areas of the mask. Hence, such techniques are not ideally suited to even the fabrication of the anode in an organic polymer display as the lower cost benefits of the organic polymer materials, and in particular in the production of larger size displays, cannot be fully realised.

Figure 2:
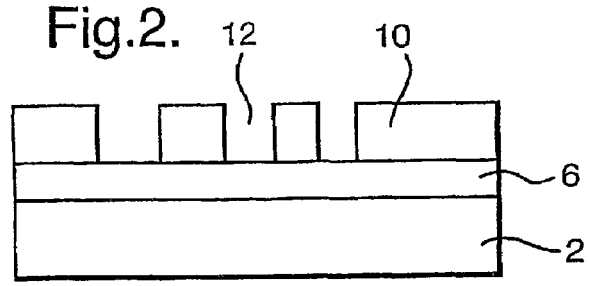
FIG. 2 is a diagrammatic illustration of a known photolithographic patterning technique.

Photolithographic patterning of a layer, such as the patterned layer 10 illustrated schematically in FIG. 2, which typically could comprise the cathode shown in FIG. 1, can be achieved in conventional LCD or LED displays by using a photoresist in combination with either dry or wet etching to selectively remove the unwanted areas 12 to provide the required pattern in the patterned layer of the photoresist 10. Alternatively, the photoresist layer may be used in combination with an evaporation or "lift-off" technique to achieve the required pattern. Such techniques are well known in the art and will not, therefore, be described further in the context of the present invention. However, as can be seen from FIG. 1, in an organic polymer electroluminescent display the cathode 8 overlies and is in contact with the organic polymer layer 6. Hence, for the fabrication of the cathode 8, very severe difficulties and drawbacks are encountered if a photolithographic technique is utilised.

Because the layer 6 is in an organic material, it will react with the chemicals used in the photolithographic process, such as the photoresist solution, the developer, and the stripper used to strip the photoresist layer after patterning of the layer. For example, the organic material of the layer 6 may be dissolved and/or it may be doped by the photoresist materials. The doping can take many forms but typically this can give rise to quenching or site trapping within the organic material. Furthermore, UV light, which is used for the exposure of photoresist, can give rise to photo-oxidation or bonding defects in the organic layers. These not insignificant difficulties arising from the reaction of the organic polymer materials to the conventional photolithographic process are far more serious than the actual cost burden of the process itself, because the actual performance quality of the organic materials is seriously degraded by the use of the process; i.e. a lower performance display is created but with high fabrication costs..

Figure 3:
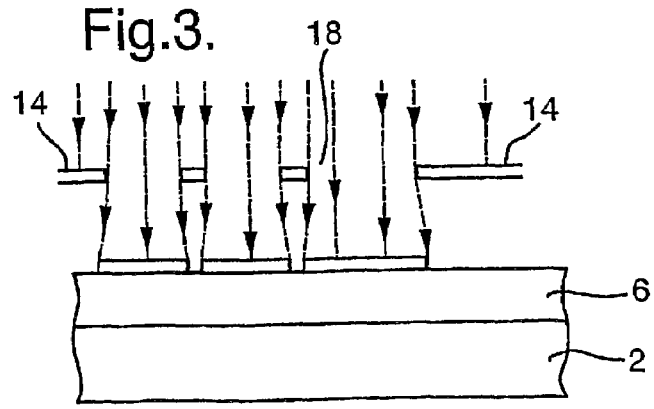
FIG. 3 is a schematic illustration showing the use of a metal shadow mask for cathode patterning.

The use of metal shadow masks has also been proposed for cathode patterning. As can be seen from FIG. 3, this process involves the use of an apertured metal mask 14, usually of stainless steel. The cathode material is deposited by evaporation deposition but the mask 14 is spaced slightly from the organic layer so as to prevent the metal mask from contaminating the organic layer and from creating defects in the organic layer. As the evaporated material passes through the apertures 18 in the mask its deposition angle can change in direction, depositing material over a wider area than that defined in the mask and giving poor resolution for the deposited cathode. Furthermore, the mask must necessarily be a negative image of the actual required cathode pattern so the mask comprises only relatively thin strips of metal (corresponding to the spacing between the elements in the cathode array) arranged between relatively large apertures. For this reason the mask is not mechanically robust and cannot be used to fabricate cathodes for large area displays. If the mask is made more robust by providing wider strips of metal, there is a corresponding increase in the spacing between adjacent electrodes of the cathode, which reduces the emissive area and the resolution of the display. Additionally, a parallel deposition beam is necessary over the entire area of the display. As will be appreciated, as the display area is increased, it then becomes necessary to increase the distance between the source of cathode material and the target substrate in order to ensure that a parallel material beam is provided throughout the relatively large deposition area. The deposition chamber becomes, therefore, large in size and furthermore, most of the evaporated material deposits on the walls of the chamber and not on the target substrate. Both of these factors increase processing costs and, hence, the cost of the final display device. Additionally, to enable the shadow mask to be reused, material which is deposited on the shadow mask must be removed to maintain the required definition of the apertures 18 in the mask. Cleaning of the shadow mask can also be problematical, giving rise to further increased production costs for the display device.

Figure 4:
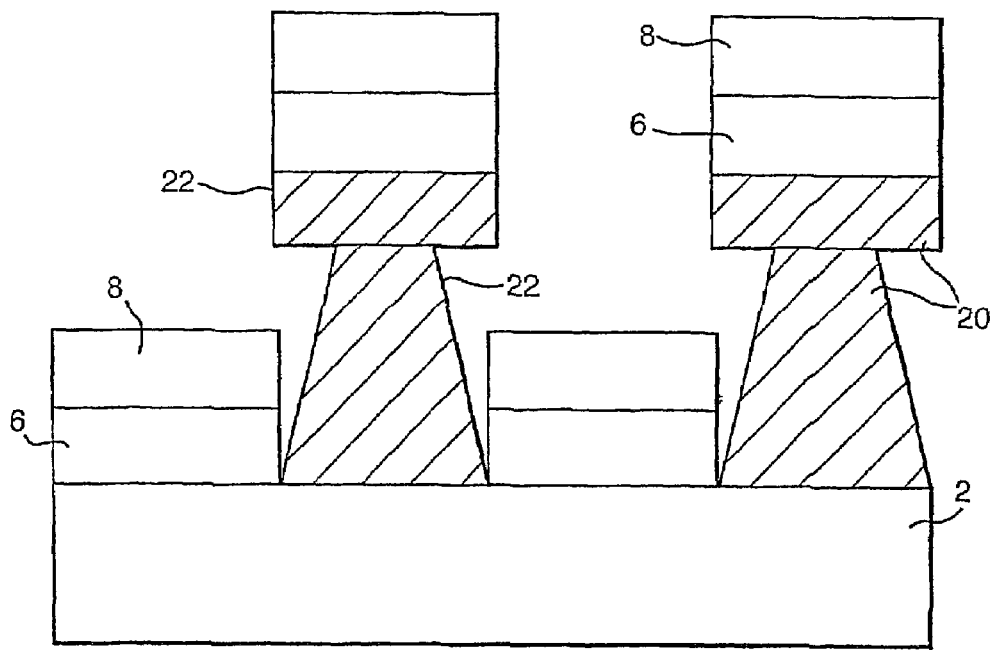
FIG. 4 is a diagrammatic illustration of prepatterned mushroom shape dividers for cathode patterning.

Pre-patterned mushroom shape dividers 20, as shown in FIG. 4, have also been proposed for cathode patterning. The mushroom shape dividers are formed on the substrate, with the subsequent deposition of the organic polymer material 6 and the cathode 8. With these mushroom-shaped dividers, it is possible to form cathode columns, which are electrically isolated from each other, without the use of a metal shadow mask. However, the mushroom shape dividers 20 are usually fabricated by a combination of a photolithographic process and an isotropic etching process, which requires a mask and is a relatively lengthy and, therefore, expensive process. Furthermore, in view of the angle of the deposition beam required to deposit the cathode material, deposition of the material onto side surfaces 22 of the mushroom shape dividers 20 may occur due to the obliquely incident deposition beam, giving short circuits between the cathode columns. These difficulties increase with the size of the display area because the evaporating deposition process for a large area requires a more oblique deposition beam than for a small area. It follows, therefore, that such dividers are not suitable for large area patterning of cathodes.

Figure 5:
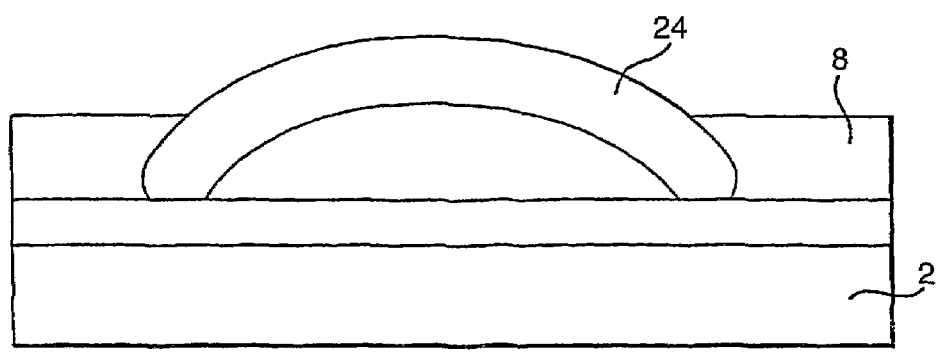
FIG. 5 is a diagrammatic illustration a polymer mask fabricated by inkjet deposition.

The use of an inkjet printed shadow mask of an inert polymer has also been proposed for the fabrication of a patterned cathode on the emissive organic polymer layer. The polymer mask 24, a portion of which is as shown in FIG. 5, is printed as a series of lines onto the organic polymer layer, the spacing between the inkjet printed lines determining the width of the electrodes in the subsequently deposited cathode. The inert polymer mask 24 in the bump areas shown in FIG. 5 is lifted off using a weak adhesive tape. However, in such an arrangement, the line width of the inkjet deposited mask is relatively large, typically greater than 100 microns, which reduces the emissive areas in the final display. This is highly undesirable, especially in high definition displays. This line width arises because it is difficult to draw narrow lines with an inkjet patterning technique due to spreading of deposited solution on the surface. The spreading of the solution of the inert polymer also results in thin thickness in the deposited material, which makes it difficult to apply the conventional lift-off technique. Additionally, the process also gives rise to a relatively high density of defects, again affecting image resolution.

The above concerns exist not only with organic polymer displays but also with the fabrication of other electronic devices, but in particular those incorporating organic semiconductor materials. Furthermore, as stated previously, the patterning of relatively long but extremely narrow lines has always proved problematical because the etch masks cannot be provided with sufficient mechanical robustness to accurately define such lines. The present invention seeks to provide a solution to these concerns with the known techniques by depositing an etchant onto the material to be etched in the form of droplets. If the deposition of the droplets can be adequately controlled, and the etchant is chosen so as to dissolve or react chemically with the material to be etched, very fine and accurately defined patterns may be etched in or through the material without the requirement of a photolithographic or shadow mask.

It has been realised with the present invention that such accurate deposition of the etchant can conveniently be achieved through the use of a print head of the type having a nozzle from which the material may be ejected as a series of droplets. A readily available print head of this type is an inkjet print head and the present invention will be subsequently described with reference to such a print head. However, it is to be realised that other mechanisms can also be used to carry out the method of the present invention such as the use of a very fine, for example a micro-pipette, moved under computer control over the surface of the material to be etched. Typically, the nozzle used to carry out the method of the present invention will have an ejection orifice of less than about 100 microns diameter.

Additionally, the present invention is also described below with reference to the use of a solvent as the etchant material. However, it should also be appreciated that the etchant may equally comprise a substance which reacts chemically with the material to be etched to provide a further material which can, for example, be removed by washing.

Referring now to FIGS. 6A to 6F, the present invention will be described with reference to the principle of inkjet etching to pattern holes or lines in an organic layer. This principle of etching, in particular by the use of an inkjet print head, has been found to be particularly advantageous because, as will become apparent from the following description, the use of such inkjet print heads for etching enables both an anode and a cathode for a display to be fabricated without the use of photolithography or shadow masks. For organic polymer displays in particular, this becomes increasingly important with increase in display area as the difficulties, and hence the costs of using known processes utilising photo or shadow masks, increases significantly.

FIGS. 6A to 6F illustrate the principle of such inkjet etching with respect to a layer of material which may comprise an organic polymer material for use in an organic polymer display. However, it is to be appreciated that the principle of inkjet etching is not limited to the fabrication of such materials or such displays but may be used in any application where it is necessary to define precise patterns in a material, such as in the fabrication of masks (for example, optical shadow masks) or the fabrication of dewetting bank structures, also used in the fabrication of electroluminescent displays.

Figure 6A:
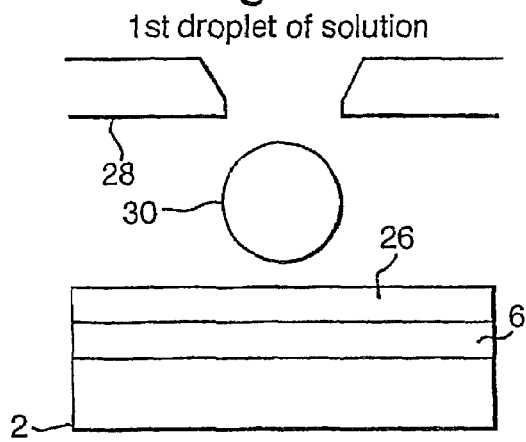
FIGS. 6A to 6F show diagrammatically the process of inkjet etching of an organic polymer layer.

As can be seen from FIG. 6A, the substrate 2 supports the layer 6 of photoluminescent non polar organic polymer material, which may comprises polyfluorene or a copolymer of fluorine in combination with a conjugated molecule group, such as F8, F8BT or TFB or any blend thereof. The layer 6 can be applied by spin coating or inkjet deposition of a solution in which a non-polar organic solvent, such as toluene, xylene, mesitylene, or cyclohexylebenzene, is used. A further layer 26 of a polar organic material, such as poly(vinylphenol), (PVP), poly(vinylalcohol) (PVA) or polymethylmethacrylate (PMMA), a conjugated molecule or conjugated polymer or a copolymer thereof, is deposited onto the photoemissive layer 6. The layer 26 is typically about 1 micron in thickness. A polar solvent, such as methanol, ethanol, butanol, isopropanol 1-propanol, 2-1 propanol acetone or dimethylimidazolidinone, is deposited onto the layer 26 from an inkjet print head 28 as a series of droplets, two of which, droplets 30 and 32, are shown in FIGS. 6A to 6F.

It has been found in the present invention that inkjet deposition of etching substances forms a quite unique thickness profile when the etchant has dried or evaporated. There is most of the material to be etched contained in the edge region of the droplet after deposition onto a solid surface, and there is relatively little of the material in the middle region of the droplet. The physics of the hole formation with a solvent drop is different from that of the conventional wet etching process. In the conventional case, bulky etchant and rinse liquid etch and wash away a target material. In such an etching process, the material is diffused into the liquid or is flowed away from the substrate. In the present invention, the material is not removed from the substrate with a bulk flow of solvent. The material is transferred locally from the centre region of the hole to the edge. This etching mechanism can be understood in terms of a micro-fluid-flow in a sessile drop. This microfluid-flow has been proposed to explain the formation of ring-shaped "coffee stain" from a drop of solution on a solid surface. When the drop of solution dries on the surface with a pinned contact line, such a flow takes place in order to compensate the difference in the volume change and evaporation rate across the droplet. In the edge region of the drop, the evaporation rate of solvent is high, but the volume change is restricted by the pinned contact line. In the centre region, on the other hand, a larger volume change happens with a lower evaporation rate. The radial micro-fluid-flow supplies the solution to the edge region from the centre to compensate for this difference. As a result, there is an enhanced deposition of the solute in the edge region and a thinner layer than expected is formed in the centre region. The same mechanism is believed to occur in the hole formation. When a solvent drop is deposited on an insulator, the insulator is partially dissolved in it. The insulator dissolving in the solvent drop is carried by the flow from the centre to the edge, and solidifies there, resulting in the formation of a crater-like hole. The polymer in the ridge is dissolved in deposited solvent drops, but it cannot diffuse to the centre area because the fast micro-fluid-flow pushes back the solution involving the polymer. In other words, the net mass flow of the polymer always takes place in the direction from the centre to the edge, resulting in complete removal of the material from the centre region.

Figure 6D:
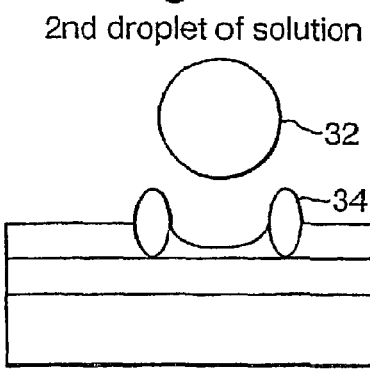
Figure 6B:
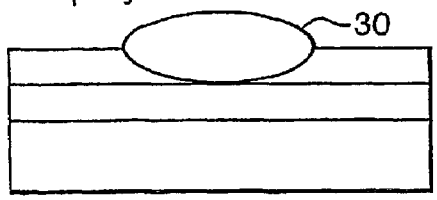
Figure 6E:
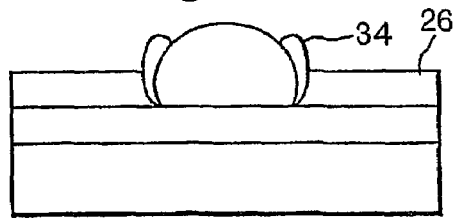
Figure 6C:
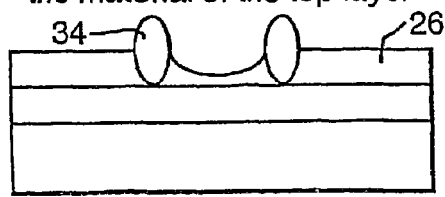
Figure 6F:
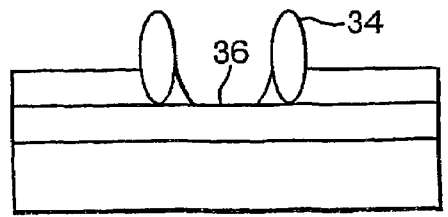

When the first droplet of solvent 30 is deposited onto the layer 26, the droplet tends to spread laterally and there is partial dissolving of the layer 26 into the solvent, as shown in FIG. 6B. As the solvent evaporates, a ring 34 of the polymer material of the layer 26 builds up around the edge of the droplet 30, as shown in FIG. 6C. This is due to the polymer being carried by the radial micro-fluid-flow. The polymer carried is redeposited at the edge region shown in FIG. 6B. As shown in FIG. 6D the second droplet 32 of solvent is then deposited into the ring 34 created by the deposition of the first droplet. From FIG. 6E, it can be seen that the ring 34 acts to contain the second droplet 32 and prevent lateral spread of the solvent. The second droplet 32 etches further into the layer 26 and as the solvent evaporates, the height of the ring 34 is increased, as shown in FIG. 6F. Any subsequent droplets of solvent are likewise retained by the ring 34 until the layer 26 is etched through to expose an area 36 of the underlying material comprising the layer 6. Also, it should be noted that when only the first solvent droplet is able to dissolve the polymer right through to the bottom of the layer and etching to the underlying material has effectively been achieved with a single droplet, the second and subsequent droplets are not necessarily required. The subsequent droplets, however, after reaching the bottom of the etched hole, can be useful to eliminate the polymer material completely from the base of the hole created. This can be particularly beneficial when the underlying material has an uneven surface, as shown in FIGS. 7A and 7B.

Figure 7A:
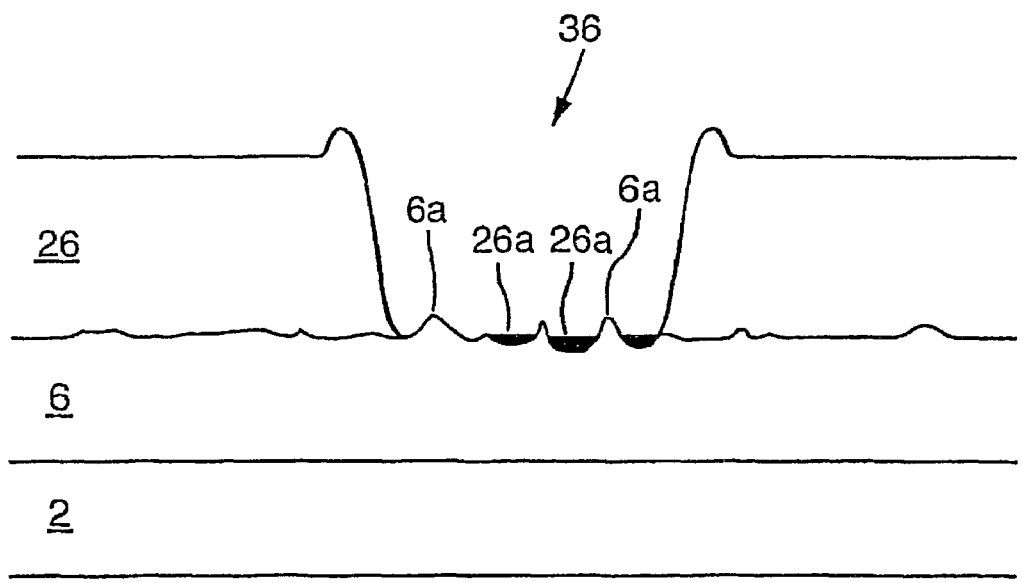
FIGS. 7A and 7B show diagrammatically one of the benefits arising from etching with a substance for which an underlying layer is able to act as an etch stop layer for the substance.
Figure 7B:
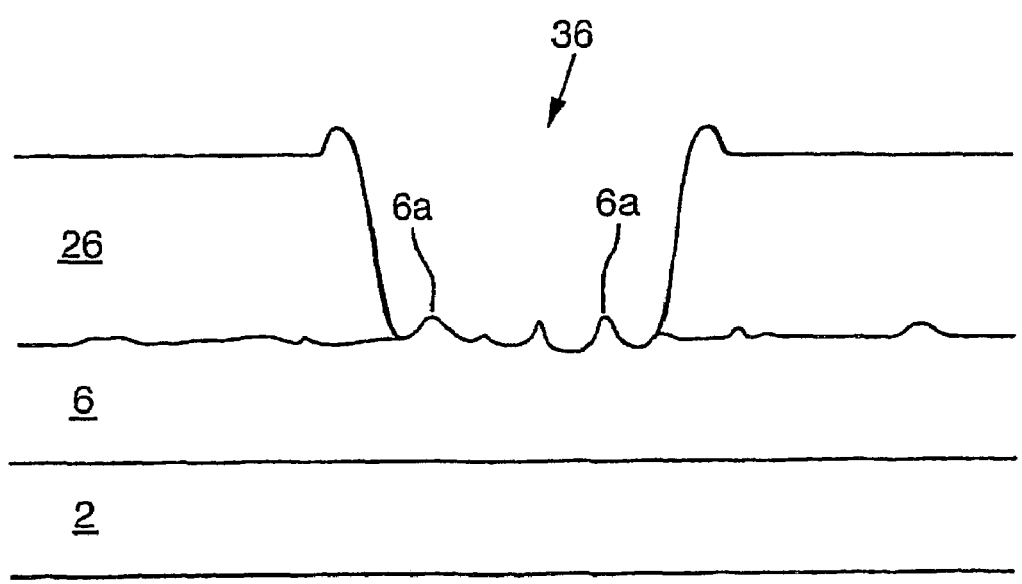

From FIGS. 7A and 7B it can be seen that the layer 6 has an uneven surface. When the area 36 of the layer 6 is reached by the solvent droplets, small peaks of the layer 6, shown as peaks 6a in FIG. 7A, first become exposed. However, small areas of the layer 26, shown by dark areas 26a in FIG. 7A, remain between the peaks 6a of the layer 6. Because the solvent is chosen such that it will dissolve the material of the layer 26 but not the material of the layer 6, i.e. the material of the layer 6 acts as a natural etch stop for the solvent etchant, the subsequent droplets of solvent can be used to eliminate the areas 26a from the area 36 without concern about etching the layer 6, to leave a hole in the layer 26 with a base, comprising the surface of the layer 6, which is not contaminated with areas of the material of the layer 26, as shown in FIG. 7B.

Figure 8:
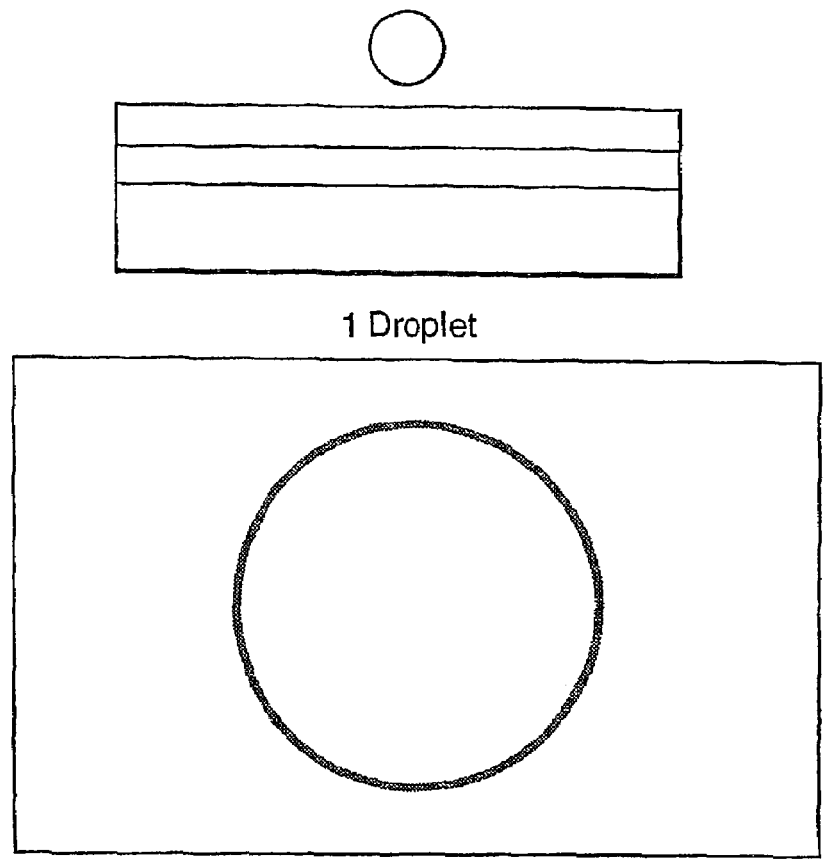
FIG. 8 illustrates plots of layer thickness achieved during inkjet etching.
Figure 8:
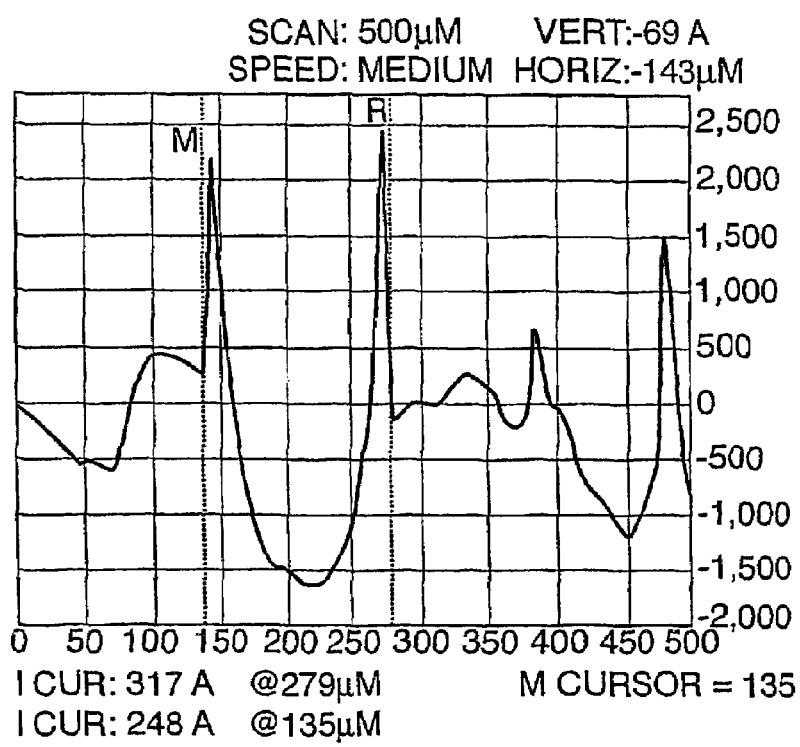
Figure 8:
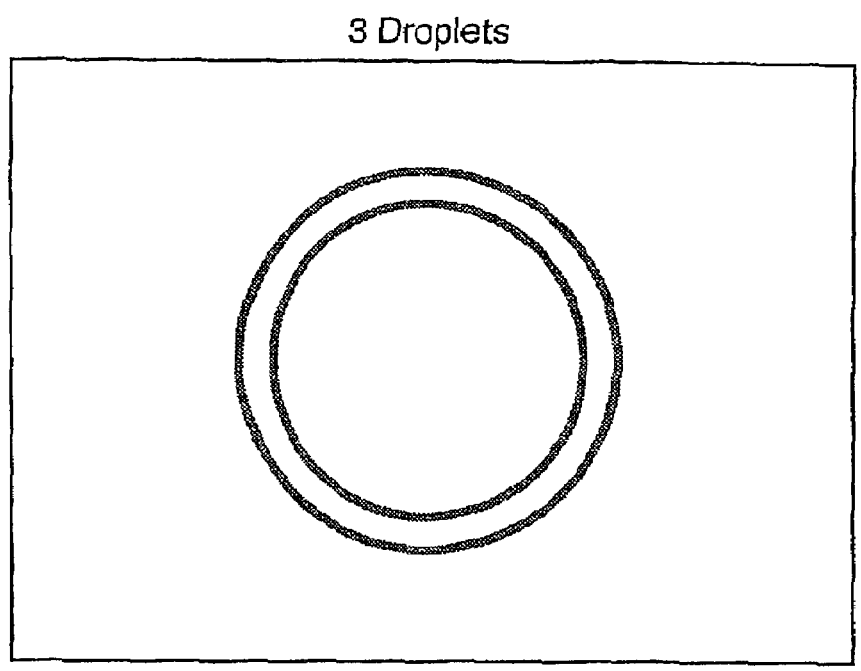
Figure 8:
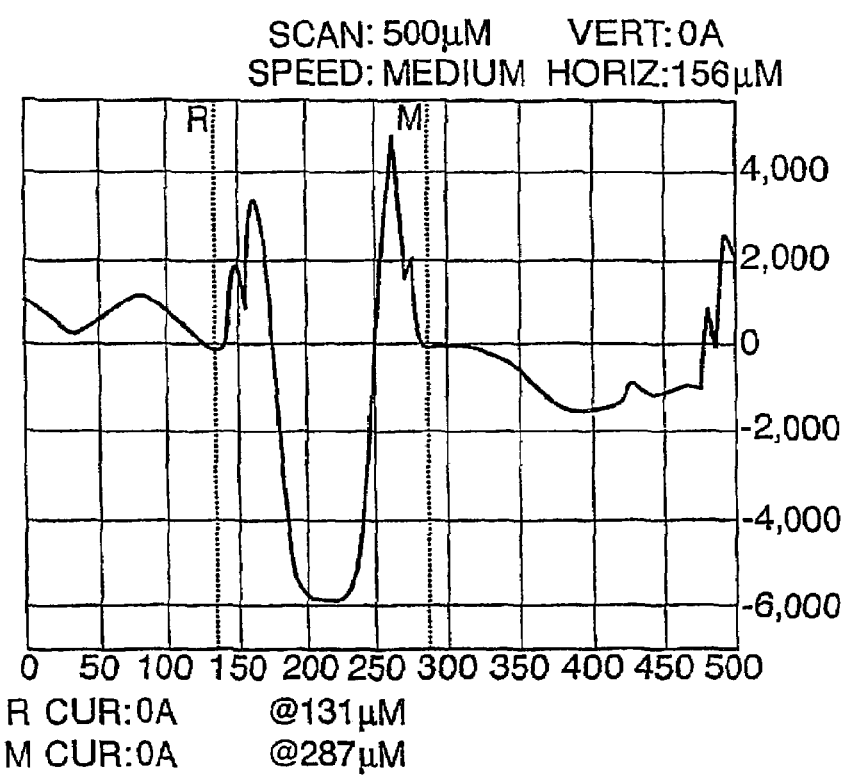
Figure 8:
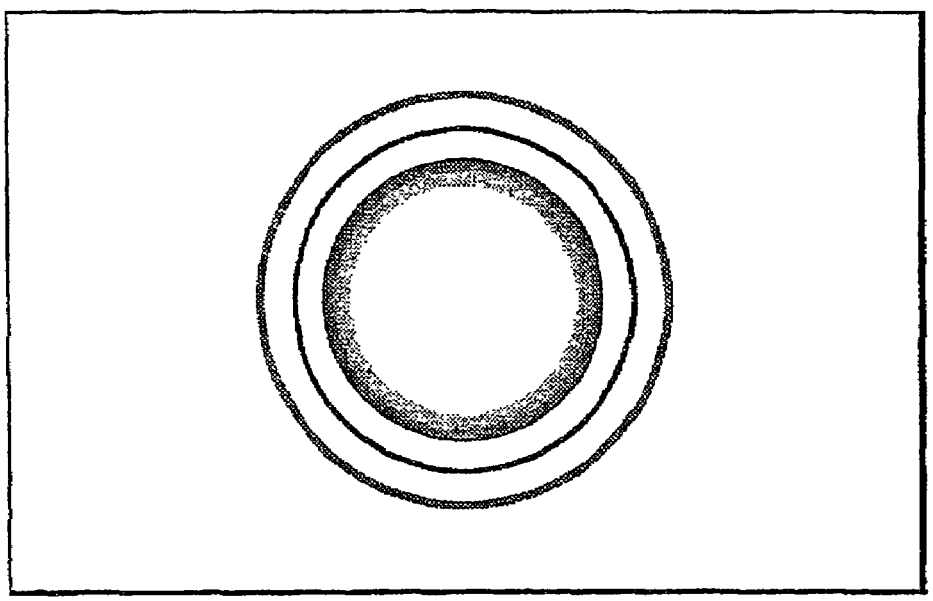
Figure 8:
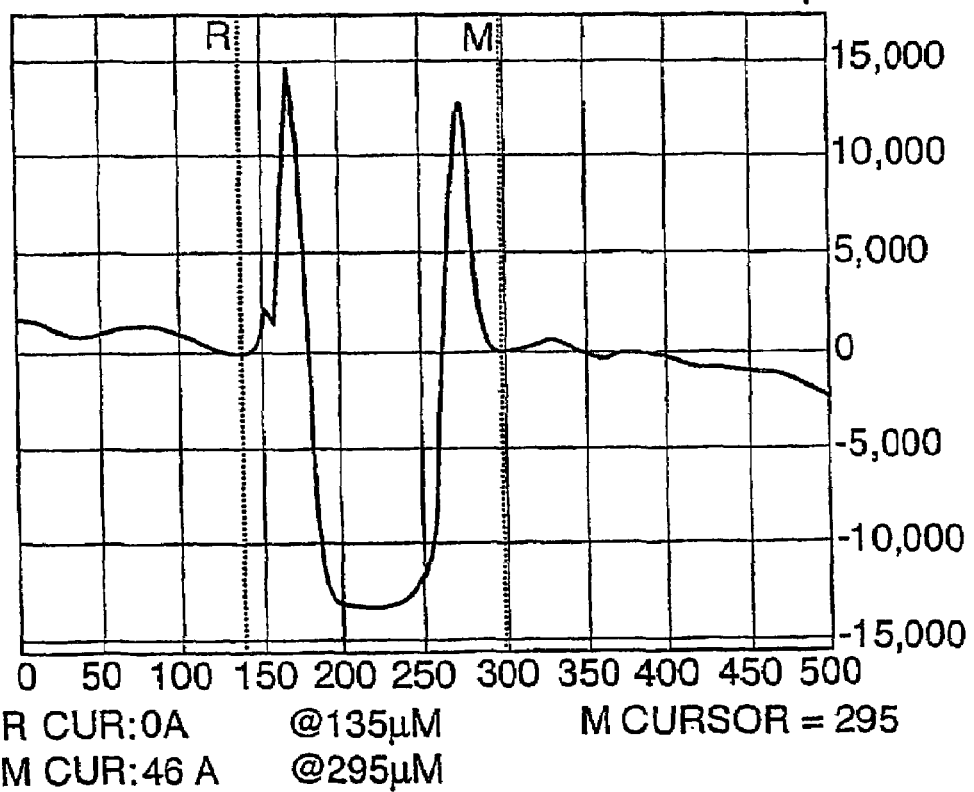

FIG. 8 shows measurements resulting from scanning across a nucleation ring formed by inkjet deposition of, respectively, 1, 3 and 8 solvent droplets onto a relatively thick organic insulator layer, such as the layer 26, which may comprise PVP, referred to in FIGS. 6A to 6F. What is interesting to note from the plots shown in FIG. 8 is that as further droplets of solvent are inkjet deposited onto the layer, the width of the hole etched into the layer tends to be better defined with wall structures which have relatively large angles. Furthermore, the etched hole size at a depth within the hole or ring approximately level with the surface of the layer external to the ring tends to decrease with the deposition of further droplets. This is due to some of the material dissolved in the solvent in the lowermost regions of the etched hole being re-deposited onto the wall surfaces of the hole as the solvent evaporates. This is considered to be a particularly advantageous aspect of inkjet etching as very narrow and well defined patterns can be etched in the layer to be patterned.

By utilising this aspect of inkjet etching, patterns or lines can be etched having a width less than the diameter of a droplet of the solvent when deposited onto the layer 26. It should be noted that this aspect of inkjet etching can be used for both solvents which dissolve the material to be etched or substances which etch by reacting chemically with the material to be etched.

With current inkjet heads, droplets of solvent having a diameter of about 30 microns can be ejected from the nozzles of the head. However, such solvents typically have a contact angle of about 8° and thus a deposited solvent droplet typically assumes a diameter of about 60 to 70 microns, once deposited onto a layer of material.

Figure 9A:
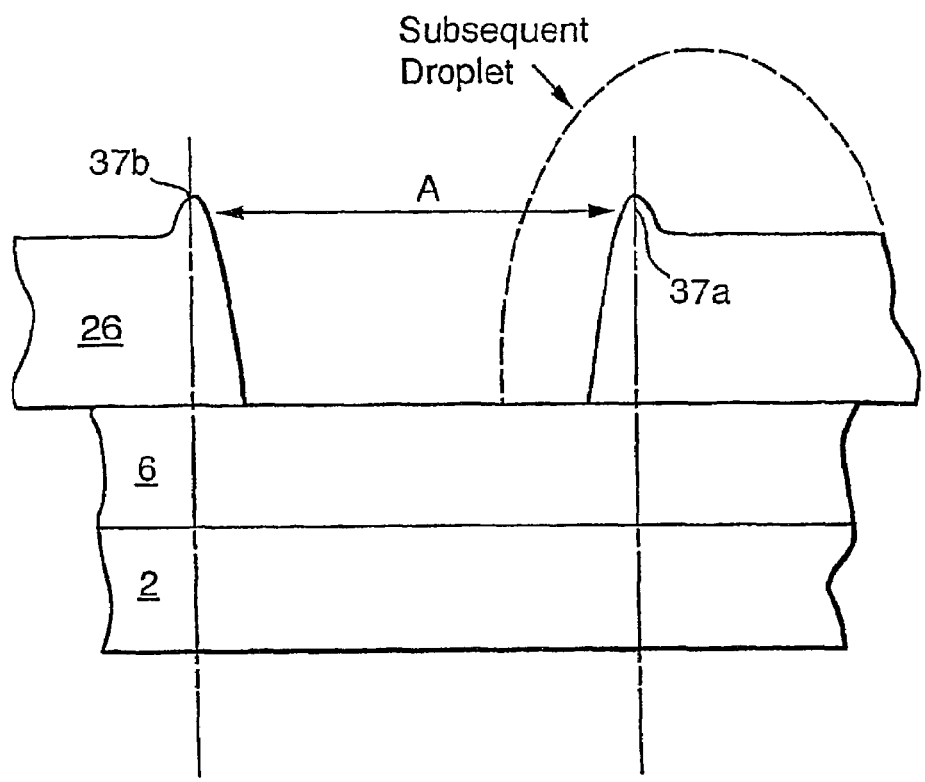
FIGS. 9A and 9B illustrate how the present invention can be employed to fabricate relatively long but very narrow etched lines in a material.
Figure 9B:
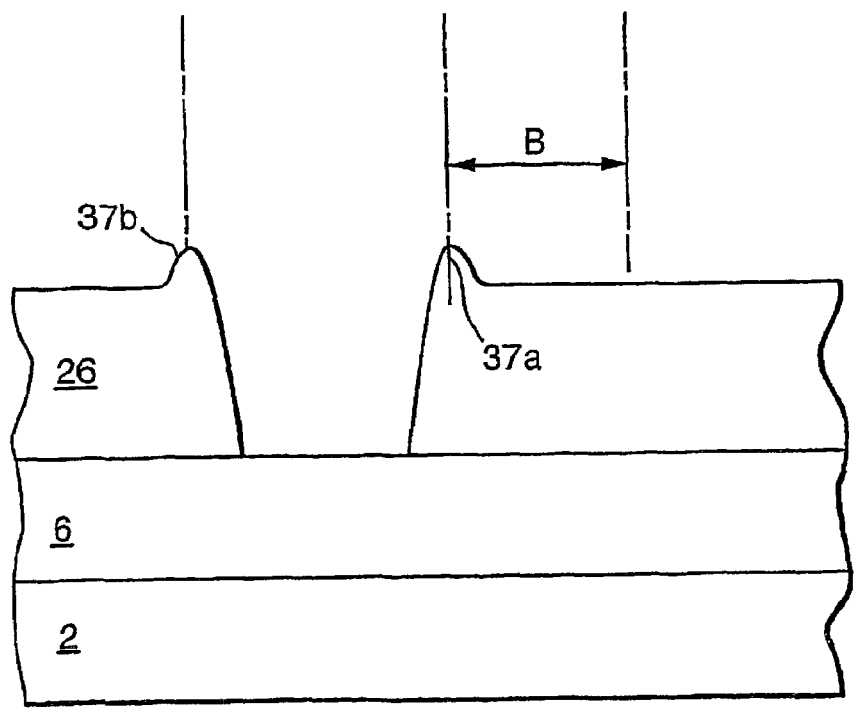

Referring to FIG. 9A, which shows a trough or channel formed in the layer 26 by inkjet etching, the channel has a width, shown as A, which is determined principally by the diameter of the deposited droplets of solvent, the type of solvent, and the wettability of the surface of the layer 26. When subsequent droplets of solvent are selectively deposited to cover boundary portion 37a of the channel, the material of the layer 26, which forms the boundary portion 37a, is dissolved in the subsequent droplet of solvent. The material of the layer 26 flows within the droplet and concentrates towards the edge of the droplet—this is the principal by which the boundary portion 37a (also known as a nucleation edge) was created during etching of the channel in the layer 26. Hence, as subsequent droplets of solvent are deposited onto the boundary portion 37a, the boundary portion can be caused to migrate towards boundary portion 37b, located on the opposite side of the channel, thereby to reduce the width A of the channel. This is shown by a shift B in FIG. 9B. In this manner very narrow lines or channels can be fabricated by etching which have a width narrower than the diameter of a deposited droplet of solvent. Furthermore, once the channel is reduced to the required width by the above technique, the process may be repeated in a position offset from the channel, for example, to the right of the subsequent droplet as shown in FIG. 9A, so as to create a very narrow ridge of the material of the layer 26 between adjacent channels, the channels each having a width smaller than the diameter of the droplets of solvent as deposited onto the surface of the layer 26.

The following example explains strip-shaped cathode patterning on the photoemissive organic layer in an organic light emitting device by way of inkjet etching and a lift-off technique.

Figure 10A:
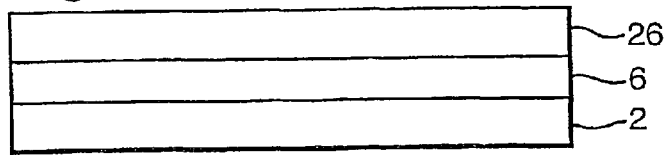
FIGS. 10 to 10H illustrate diagrammatically an embodiment of the present invention for the fabrication of a cathode for the display device shown in FIG. 1.
Figure 10B:
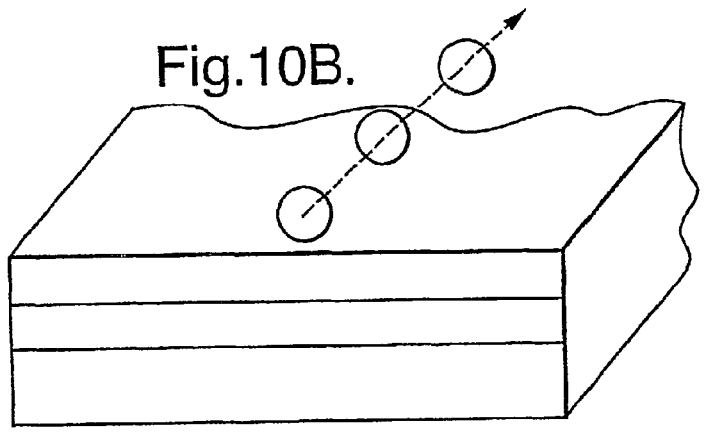
Figure 10C:
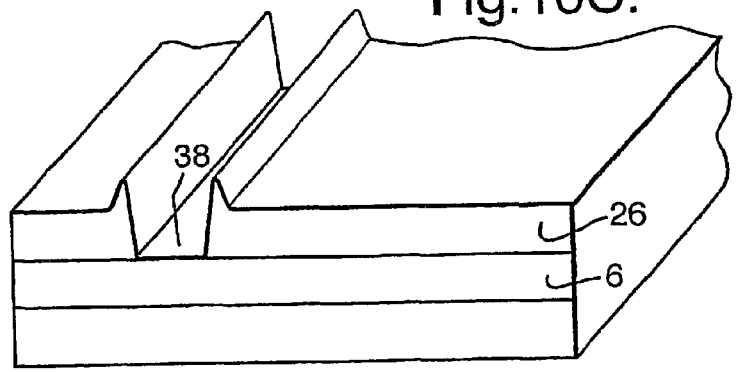
Figure 10D:
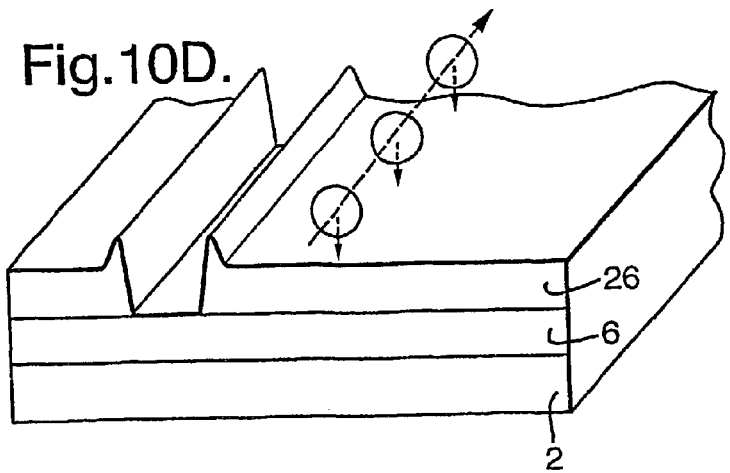
Figure 10E:
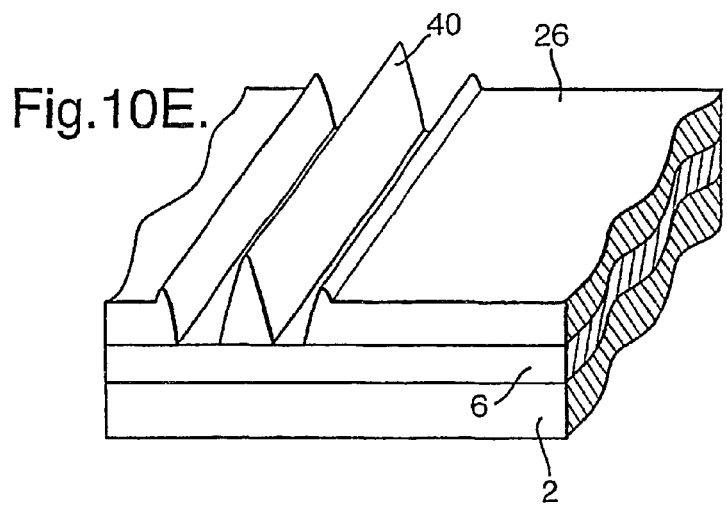
Figure 10F:
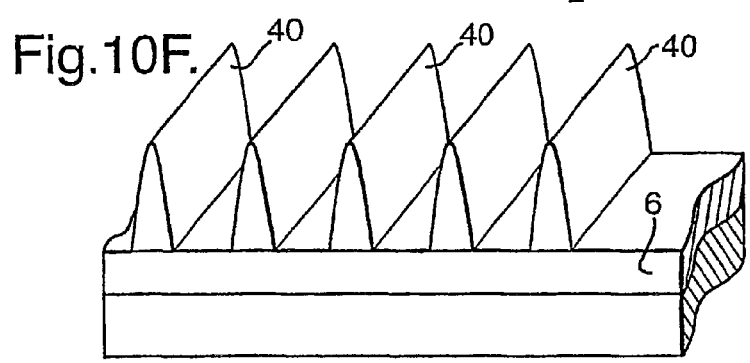

FIGS. 10A to 10D illustrate the patterning of a narrow line in the layer 26 of organic insulator material, for example PVP, overlying the layer 6 of photoemissive organic polymer supported on the substrate 2. As can be seen from FIG. 10B, the inkjet print head (not shown) is moved over the surface of the layer 26 to deposit a plurality of droplets of the solvent, such as methanol, ethanol, and propanol. Preferably, the droplets are deposited so that adjacent droplets partially overlap each other. In this manner, a narrow trough or channel is created in the layer 26 and the process is repeated until the solvent etches completely through the layer 26 to expose the elongate strip area 38 of the layer 6. The inkjet head is then moved laterally across the surface of the layer 26 and the process is repeated to etch subsequent troughs in the layer 26, adjacent troughs being separated by elongate ridges 40 of the PVP organic insulator material. The resulting structure is shown in FIG. 10F. It should be noted that because the PVP organic insulator material of the layer 26 is a polar organic material, and the photoemissive organic material of layer 6, such as F8, is a non-polar organic material, the solvent used to dissolve and etch through the layer 26 will not dissolve the layer 6. Hence, the layer 6 acts as a natural etch stop layer for the inkjet etching process. By using inkjet etching of the layer 26 as described above, ridges 40 having a width of less than 10 microns at the base can be easily achieved.

In principle, it is possible to deposit lines of material by inkjet deposition of a solution of the material. However, in practice it is extremely difficult to deposit material in narrow lines whose width is about 10 microns by inkjet deposition. Even if the diameter of a deposited droplet is 10 microns, which is a very small size even for a state-of-the-art inkjet head, this 10 micron droplet spreads up to more than 20 microns on a substrate. The resulting line width is more than 50 microns from a water-based solution, which has a high surface tension resulting in less spreading, and more than 100 microns from a non-polar organic solvent based solution. This aspect of spreading of solution is disadvantageous but with appropriate control of the positioning of the print head a solution to this limitation can be provided, as has been described with reference to FIGS. 9A and 9B, to enable such very narrow lines to be achieved.

Also, in some cases, there can remain a very thin PVP layer between the ridges 40 on photoemissive layer 6. This thin PVP layer could lower the efficiency of light emitting devices when cathode metal is deposited on this thin layer. However, this thin layer can be eliminated by multiple deposition of the solvent into the region between the ridges 40. Adding a small amount of a solvent of photoemissive layer 6, such as toluene or xylene, to a solvent of PVP is also very effective to remove the very thin PVP layer from the surface of the layer 6. For example, a mixture of isopropanol 98% and toluene 2% can be used as the solvent for inkjet etching. Toluene in the mixture etches the photoemissive layer 6 very slightly, and this promotes complete removal of the PVP layer from the surface of photemissive layer 6.

Figure 10G:
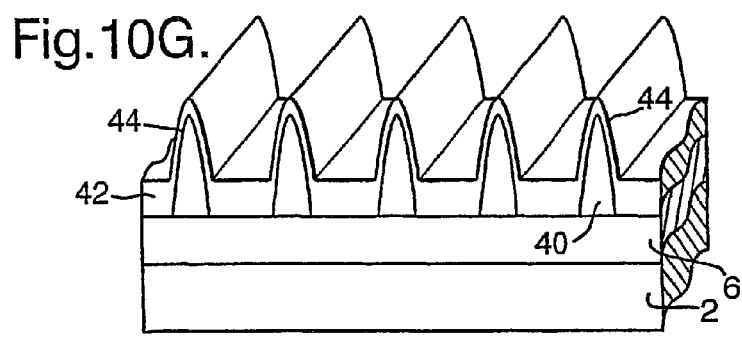
Figure 10H:
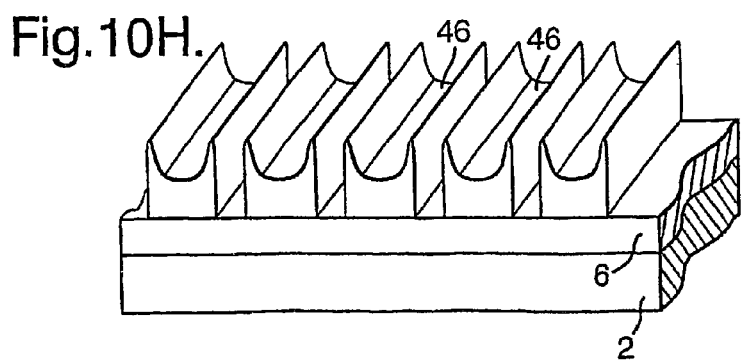

A layer 42 of conductive material, such as a bi-layer of calcium and aluminium having a work function of less than about 4.0 electron volts, is then deposited over the ridges 40 of the PVP organic insulator material. It can be seen that the inkjet etching of the layer 6 creates elongate ridges 40 with steep side portions. Hence, layer 42 deposits much more thickly in the base areas of the troughs between the ridges 40 than in regions 44 on the steep side walls of the ridges 40, as can be seen from FIG. 10G. The conductive layer 42 can be deposited using any suitable process, such as by sputtering or evaporation deposition. The structure shown in FIG. 10G is then washed in a polar solvent for the PVP material of the ridges 40, such as methanol, ethanol, acetone, or propanol. This lift-off process is possible because the layer 42 is relatively thin or may contain small perforations in the regions 44, so the solvent is able to reach and dissolve the ridges 40 to create an array of conductive strips 46 overlying the photoemissive organic polymer layer 6, as shown in FIG. 10H. The lift-off process can, if necessary, be performed with a sonic bath in which ultra-sonic agitation can be applied to break down the conductive layer 42 in the regions 44 and to assist the exposure of the ridges 40 to the solvent.

It will be appreciated that the conductive strips 46 can be used as a cathode for the photoemissive organic polymer layer 6 and that the cathode has been fabricated, through the use of inkjet etching, without the need for expensive and difficult photo masks or shadow masks. The solvent used in inkjet etching does not affect the surface of the emissive layer 6 because the organic material for the emissive layer 6 is not soluble in the etching solvent and because it is possible to remove the patterning material (for example PVP) from the surface of the emissive layer 6 as mentioned above. Furthermore, because the ridges can be defined to a width of less than 10 microns, there is very little loss of display area. For example, 20 microns width of spacing area between cathode strips with 100 microns pitch for the strips can be achieved very easily by inkjet etching and a lift-off technique and this gives an emissive area ratio of 80%, which is sufficient to provide a very bright and efficient organic light emitting display.

The principle of inkjet etching can also be used very advantageously in the fabrication of anodes for electroluminescent displays which, as stated previously, are usually fabricated by conventional photolithographic techniques using photo masks, which do not lend themselves easily to the fabrication of large area displays. This process will now be described with reference to FIGS. 11A to 11F.

In the above described example of the present invention, poly(vinyl phenol)(PVP) is used as the material for patterning, but this does not mean PVP is the only material useful for inkjet etching. Inkjet etching is available for a layer made of any soluble material or mixture of materials by using solvents which have good solubility for the layer. An important consideration for the patterning material is to use a material whose solvent does not substantially dissolve and affect an underlying layer or substrate. With this condition, the underlying layer or the substrate can act as an etch stop layer, so inkjet etching can be carried out with the added advantage of not being concerned about over or under-etching. Also, not only strip shapes but also dots, or any arbitrary pattern can be etched by control of etchant ejection and translation of the inkjet head.

Figure 11A:
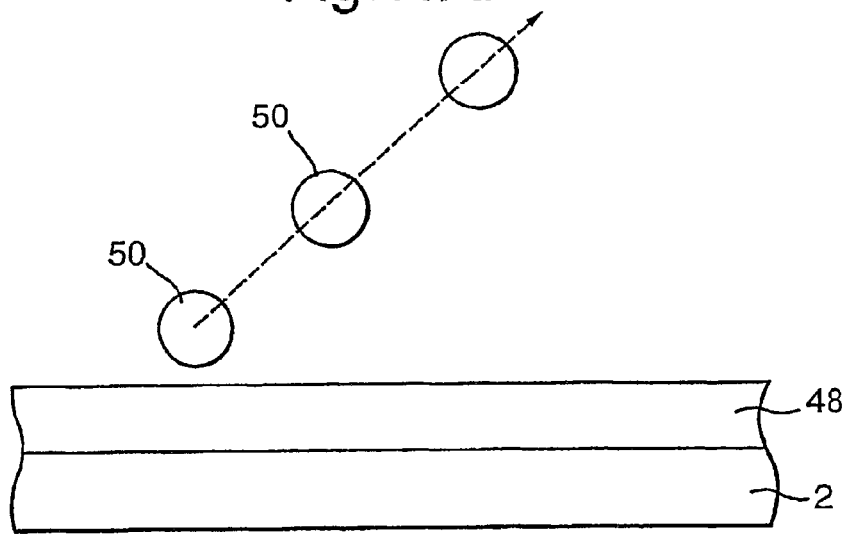
FIGS. 11A to 11F illustrate diagrammatically a further embodiment of the present invention for the fabrication of an anode for the display device shown in FIG. 1.
Figure 11B:
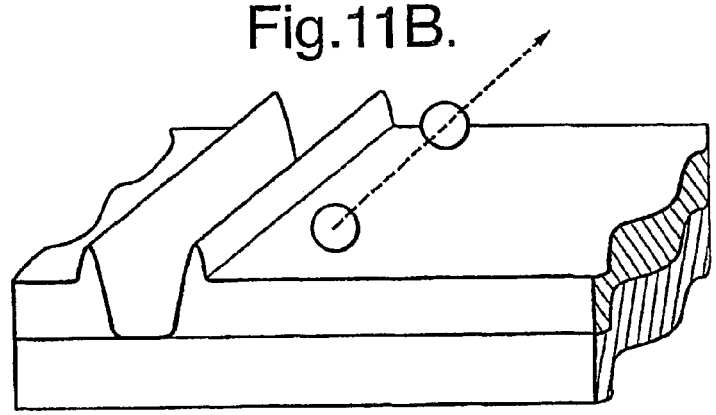
Figure 11C:
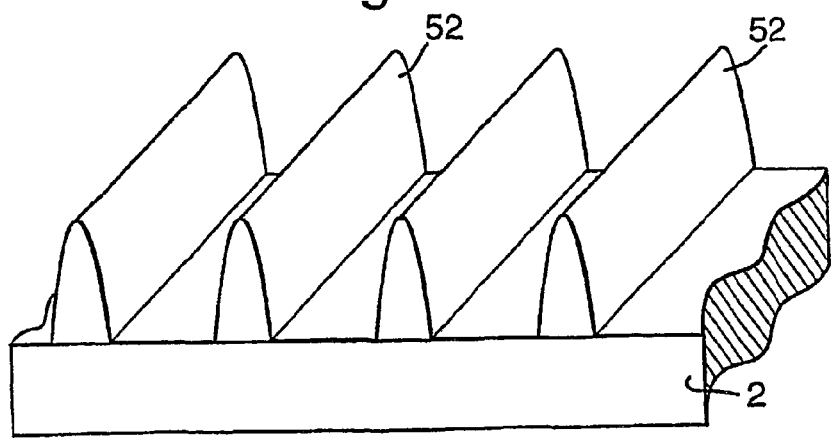
Figure 11D:
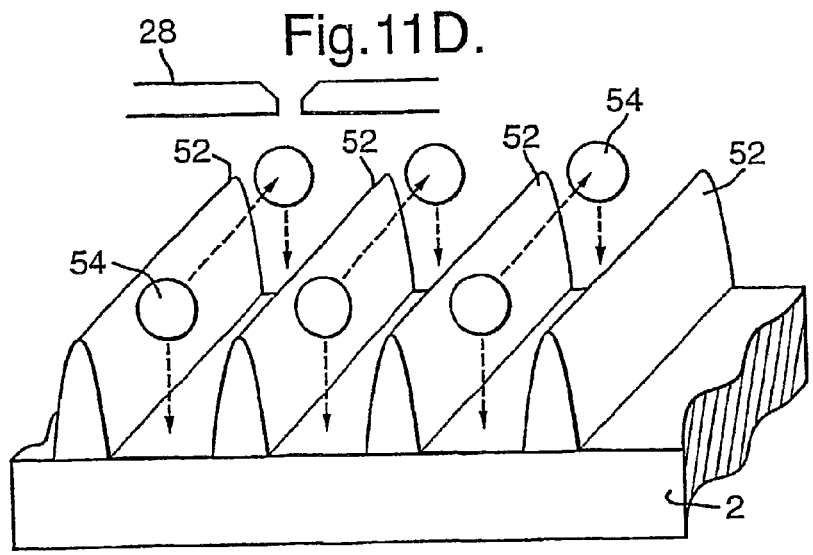

Referring to FIG. 11A, for anode electrode fabrication the substrate 2 carries a layer 48 of a non-polar organic material, such as polystyrene, polyethylene, polyisobutylene, poly(p-methyl styrene), polypropylene or F8. The substrate 2 is typically a glass substrate or a plastics substrate although silicon may also be used. The layer 48 can, typically, be provided by spin coating. As with the procedure described above for the formation of the cathode with reference to FIGS. 10A to 10H, an inkjet print head is used to selectively deposit droplets of a solvent for the layer 48. From FIGS. 11A to 11C, it can be seen that droplets 50 of a non-polar hydrocarbon solvent, such as toluene or xylene, are deposited onto the layer 48, whereby a series of troughs are etched in the layer 48 to create ridges 52 of the non-polar material supported by the substrate 2. To this stage the process is the same as that described above in relation to cathode fabrication except that different materials are used. The resulting structure can be seen in FIG. 11C. Plasma treatment with oxygen can be carried out in order to make the surface of the substrate more wetting for polar solutions. The inkjet print head 28 is then used to deposit droplets 54 of a conductive polar polymer, such as Poly(3,4ethylene dioxythiophene) (PEDOT) or polypyrrole, polyaniline, dissolved or suspended in a polar solvent, such as water. The ridges 52 are of a non-polar material so the droplets 54 do not dissolve or react with the ridges but are confined within the troughs between the ridges 52. The regions between the ridges 52 have a wetting surface for a polar solvent which can be enhanced by the plasma treatment with oxygen and, on the other hand, the non-polar ridges 52 show a dewetting property with a polar solvent. When droplets of the conductive polar polymer solution are deposited onto the substrate (having a good wetting surface) between the dewetting ridges 52, the polar solution is spontaneously confined between the ridges due to the difference in the wetting properties between the surfaces of the substrate and the ridges. This self-alignment mechanism is favourable to prevent the formation of short circuits between the conducting strips even if the width of the ridges 52 is very small, because the conductive polar polymer is confined to the areas between the ridges and does not deposit over the ridges.

Plasma dry etching using a vapour of fluorinated carbon such as CF4 can be applied after inkjet etching to remove any very thin residual layer of the non-polar material from the surface of the substrate 2. The plasma can etch the very thin residual layer. Furthermore, the surface of ridges 52, which is of organic material, is fluorinated by the vapour of fluorinated carbon, resulting in a very dewetting surface for polar solution. When the substrate is of inorganic material such as glass, this surface is not fluorinated. This results in a wetting surface for the regions between the ridges. This further enhances the self-alignment of the conductive polar polymer between the ridges, reducing further the possibility of short circuits between adjacent electrodes. The self-alignment behaviour due to the difference in wettability can, therefore, be enhanced by the use of such plasma etch steps.

Figure 11E:
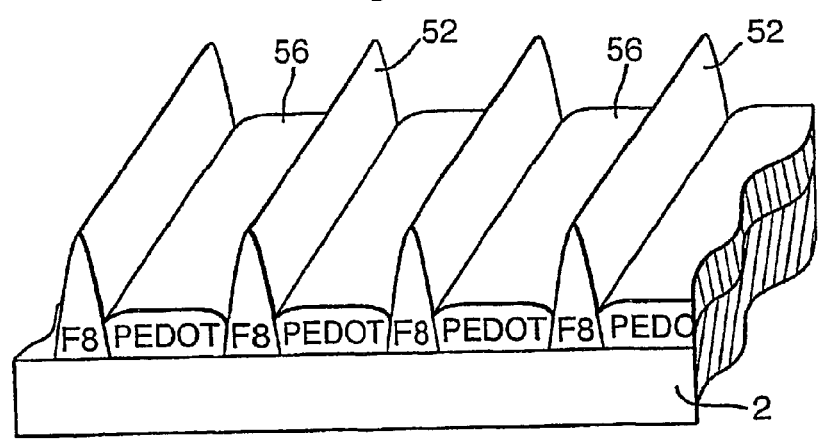

The polar solvent evaporates off to leave strips 56 of the conductive material separated by the ridges 52 of the material, as shown in FIG. 11E. The structure shown in FIG. 11E can then be washed in a non-polar solvent to dissolve the ridges 52 of non-polar material to leave the elongate strips 56 of conductive polar material on the substrate 2, as shown in FIG. 11F.

Conducting polymer material such as PEDOT, being relatively transparent and conductive, can be used to fabricate the strips 56, which may therefore be used as an anode for a display device and, in particular, an electroluminescent display device.

Figure 11F:
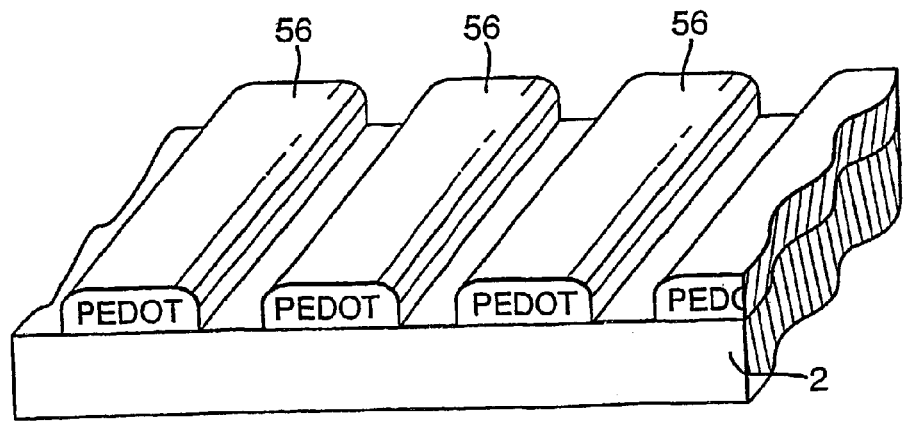

As will be appreciated, the structure shown in FIG. 11F can be coated with a layer of photoemissive organic polymer, such as the layer 6 of F8 of FIGS. 10A to 10H, followed by a layer of an inert polymer, such as PVP layer 26 of FIG. 8A. The layer 26 can then be etched using an inkjet print head and suitable solvent as described with reference to FIGS. 10A to 10H, to provide a cathode for the display.

It can be seen from the above description that by using an inkjet print head very well defined patterning of the various layers can be achieved by etching with an appropriate selectively deposited solvent. Hence, such inkjet etching can be used for fabrication of the cathode electrode or the anode electrode, or both, for a display without the use of etch masks or shadow masks.

Dry or wet etching after inkjet etching is also useful to make patterns in a substrate or underlying layers. For example, when a structure such as a substrate with the ridges 52 is dry-etched with oxygen plasma, troughs are formed in the substrate. By combining inkjet etching and conventional etching, it is possible to make patterns even in a non-soluble material at a low cost.

As will also be appreciated, the method of the present invention is of particular benefit in fabricating large area displays. As such, the invention is not limited to etching layers supported on rigid substrates such as glass, but may equally be used on plastics substrates. Furthermore, as an inkjet print head is used to etch the patterns in the various layers, the invention can be used with materials which are supported on a web or roll of a spoolable plastics substrate. Such a substrate can be fed from a supply spool to a take up spool past various processing stations where the various layers are laid down, possibly by using an inkjet print head, and subsequently etched, also by the use of an inkjet print head, to provide continuous fabrication of a display device on the web of material. The plastic web may then be sub-divided to provide discrete displays.

Furthermore, it should be realised that inkjet etching is not limited to defining patterns in materials which can be dissolved in a solvent deposited by the inkjet print head. Etchants in the form of substances which cause some chemical reaction with the layers to be etched can also be used. For example, a bi-layer of calcium and aluminium can react with sodium hydroxide. Hence, the selective deposition of sodium hydroxide by an inkjet print head onto aluminium will leave a pattern of aluminium hydroxide on the surface, which can be washed out with water. Therefore, inkjet etching can be used for the patterning of metal layers or the fabrication of masks by appropriate selection of the substance for use as the etchant. Inkjet etched masks can be used for further dry or wet etching or chemical doping of an underlying layer. Furthermore, optical shadow masks can also be fabricated by inkjet etching of a non-transparent soluble layer.

Additionally, it is known to use a bank structure for the fabrication of organic polymer LED displays. Usually, the dewetting bank structure is in the form of an array of wells in the bank material which can confine even deposited solutions from a non-polar solvent, which in general have a low contact angle and tend to spread over the surface on which they are deposited. The bank structure can also be advantageously formed by, for example, etching a fluorinated polymer layer with inkjet deposited fluorinated organic solvents to provide the dewetting bank structure.

It has also been proposed to use hydrophilic and hydrophobic patterned surfaces as templates for DNA or protein arrays. The hydrophilic regions aid to contain small volumes of different DNA or protein solutions placed on them using an automated pin-tool loading strategy. The method allows for efficient attachment, manipulation, and hybridisation of DNA strands or protein on the surface of an array. However, whilst the attachment chemistry of the DNA strands or proteins to the surface is vital, the formation of the patterned substrate is also an essential aspect to ensure that the substances under test can be precisely placed onto the array element. Typically, such array elements have been proposed to be fabricated using photolithographic techniques. However, the patterned surface of such array elements can also be fabricated using the method of the present invention and, furthermore, the DNA or protein samples under test can also be deposited onto the patterned surface using the method of the present invention.

Whilst the present invention has been described with reference to examples in which the material is etched through to expose areas of an underlying material or substrate, it should also be appreciated that the present invention can also be employed to advantageous effect when it is required only to etch into and not through the material, thereby to provide an etched pattern extending into the material. The pattern thus created can also then be arranged to receive a further material using the method of the present invention by, for example, the use of an inkjet print head.

The method of the present invention may be used to fabricate display devices for incorporation in many types of equipment such as mobile displays e.g. mobile phones, laptop personal computers, DVD players, cameras, field equipment; portable displays such as desktop computers, CCTV or photo albums; or industrial displays such as control room equipment displays.

Several electronic apparatuses using the above described display devices will now be described.

<1: Mobile Computer>

An example in which a display device according to one of the above embodiments is applied to a mobile personal computer will now be described.

FIG. 12 is an isometric view illustrating the configuration of this personal computer. In the drawing, the personal computer 1100 is provided with a body 1104 including a keyboard 1102 and a display unit 1106. The display unit 1106 is implemented using a display panel fabricated according to the present invention, as described above.

<2: Portable Phone>

Next, an example in which a display device is applied to a display section of a portable phone will be described. FIG. 13 is an isometric view illustrating the configuration of the portable phone. In the drawing, the portable phone 1200 is provided with a plurality of operation keys 1202, an earpiece 1204, a mouthpiece 1206, and a display panel 100. This display panel 100 is implemented using a display panel fabricated according to the present invention, as described above.

<3: Digital Still Camera>

Next, a digital still camera using an OEL display device as a finder will be described. FIG. 14 is an isometric view illustrating the configuration of the digital still camera and the connection to external devices in brief.

Typical cameras sensitize films based on optical images from objects, whereas the digital still camera 1300 generates imaging signals from the optical image of an object by photoelectric conversion using, for example, a charge coupled device (CCD). The digital still camera 1300 is provided with an OEL element 100 at the back face of a case 1302 to perform display based on the imaging signals from the CCD. Thus, the display panel 100 functions as a finder for displaying the object. A photo acceptance unit 1304 including optical lenses and the CCD is provided at the front side (behind in the drawing) of the case 1302.

When a cameraman determines the object image displayed in the OEL element panel 100 and releases the shutter, the image signals from the CCD are transmitted and stored to memories in a circuit board 1308. In the digital still camera 1300, video signal output terminals 1312 and input/output terminals 1314 for data communication are provided on a side of the case 1302. As shown in the drawing, a television monitor 1430 and a personal computer 1440 are connected to the video signal terminals 1312 and the input/output terminals 1314, respectively, if necessary. The imaging signals stored in the memories of the circuit board 1308 are output to the television monitor 1430 and the personal computer 1440, by a given operation.

Examples of electronic apparatuses, other than the personal computer shown in FIG. 12, the portable phone shown in FIG. 13, and the digital still camera shown in FIG. 14, include OEL element television sets, view-finder-type and monitoring-type video tape recorders, car navigation systems, pagers, electronic notebooks, portable calculators, word processors, workstations, TV telephones, point-of-sales system (POS) terminals, and devices provided with touch panels. Of course, the above OEL device can be applied to display sections of these electronic apparatuses.

The aforegoing description has been given by way of example only and it will be appreciated by a person skilled in the art that modifications can be made without departing from the scope of the present invention.

The invention claimed is:

1. A method of making a pattern, the method comprising:
ejecting a first droplet from an orifice onto a first layer formed on a substrate, the first layer including a first material and the first droplet including a first liquid material;
forming a first trough in the first layer by the first droplet dissolving a portion of the first layer;
ejecting a second droplet from an orifice onto the first trough, the second droplet including the first liquid material; and
forming a second trough in the first layer by the second droplet, a diameter of the second trough being smaller than a diameter of the first trough.

2. The method according to claim 1, the diameter of the second trough being smaller than a diameter of an area covered by the first droplet when it is deposited on the first layer.

3. The method according to claim 1, a first thickness of one part of the first layer surrounding the first trough being larger than a second thickness of parts of the first layer other than the one part.

4. The method according to claim 1, a diameter of the orifice from which the first droplet is ejected being less than 100 microns.

5. The method according to claim 1, further comprising:
providing the substrate with a second layer disposed between the first layer and the substrate, the step of ejecting a first droplet including exposing a part of the second layer that is disposed under the first layer, the second layer being exposed in the first trough.

6. The method according to claim 1, further comprising:
providing the substrate with a second layer disposed between the first layer and the substrate, the step of ejecting a first droplet including exposing a part of the second layer that is disposed under the fast layer, the second layer being exposed in the first trough, wherein the second layer acts as an etch stop layer.

7. The method according to claim 1, the step of ejecting a first droplet including the liquid material dissolving the first material.

8. The method according to claim 1, further comprising:
forming a third layer in the second trough.

9. The method according to claim 1, further comprising:
providing a plurality of orifices in a nozzle, the first and second droplets being ejected from one or more of the plurality of orifices.

10. The method according to claim 1, further comprising:
controlling a position of the orifice from which the first droplet is ejected during the ejecting of the first droplet from the orifice.

11. The method according to claim 1, the step of ejecting the first droplet from the orifice being performed after a position of the orifice is set.

12. The method according to claim 1, further comprising:
forming a third layer in the second trough by depositing a third liquid material.

13. The method according to claim 1, further comprising:
providing the substrate with a second layer disposed between the first layer and the substrate;
forming a third layer in the second trough by depositing a third liquid material, a part of the second layer being exposed through the second trough, the part of the second layer having a wettability for the third liquid material, the wettability being greater than a wettability of a surface of a periphery of the second trough.

14. The method according to claim 1, further comprising:
providing the substrate with a second layer disposed between the first layer and the substrate; and
doping a part of the second layer through the second trough, the part of the second layer being exposed through the second trough.

15. The method according to claim 1, further comprising:
forming a third layer in the second trough, the third layer being a conductive layer.

16. The method according to claim 1, further comprising:
forming a third layer in the second trough, the third layer being a conductive layer that includes a conductive material having a work function of less than 4.0 electron volts.

17. The method according to claim 1, further comprising:
forming a third layer in the second trough, the third layer being a conductive layer that comprises a conductive material including poly3,4-ethylene dioxythiophene.

18. The method according to claim 1, further comprising:
providing the substrate with a second layer disposed between the first layer and the substrate, the second layer including polyfluorene or a copolymer of fluorine.

19. A method of making a pattern, the method comprising:
providing a first layer over a substrate, the first layer having a first trough which is formed by ejecting a plurality of first droplets by inkjet method, the first layer including a first material, each of the plurality of first droplets including a first liquid material;
ejecting a plurality of second droplets onto the first trough by inkjet method, each of the plurality of second droplets including the first liquid material; and
forming a second trough in the first layer by the plurality of second droplets, a diameter of the second trough being smaller than a diameter of the first trough.

20. A method of making a pattern, the method comprising:
providing a first layer over a substrate, the first layer having a first trough which is formed by ejecting a first droplet by inkjet method, the first layer including a first material, the first droplet including a liquid material;
ejecting a second droplet onto the first trough by inkjet method, the second droplet including the first liquid material; and
forming a second trough in the first layer by the second droplet, a diameter of the second trough being smaller than a diameter of the first trough.

* * * * *